(12) United States Patent
Morse (10) Patent No.: US 8,441,796 B2
(45) Date of Patent: May 14, 2013

(54) ELECTRICAL POWER SUBSTRATE

(75) Inventor: Robert Morse, Nr Alnwick (GB)

(73) Assignee: Keronite International Limited, Cambridge (GB)

( * ) Notice: Subject to any disclaimer, the term of this patent is extended or adjusted under 35 U.S.C. 154(b) by 854 days.

(21) Appl. No.: 11/795,276

(22) PCT Filed: Jan. 16, 2006

(86) PCT No.: PCT/GB2006/000128
§ 371 (c)(1),
(2), (4) Date: Jul. 13, 2007

(87) PCT Pub. No.: WO2006/075176
PCT Pub. Date: Jul. 20, 2006

(65) Prior Publication Data
US 2008/0257585 A1    Oct. 23, 2008

(30) Foreign Application Priority Data
Jan. 15, 2005  (GB) .................................. 0500878.4

(51) Int. Cl.
*H05K 7/20* (2006.01)
(52) U.S. Cl.
USPC .......... 361/713; 361/719; 361/720; 361/762; 174/258; 174/260; 257/707; 257/760

(58) Field of Classification Search .......... 361/704–722, 361/760–762
See application file for complete search history.

(56) References Cited

U.S. PATENT DOCUMENTS

| | | | |
|---|---|---|---|
| 4,015,987 A | | 4/1977 | Garry |
| 4,615,945 A | | 10/1986 | Iida et al. |
| 5,687,062 A | * | 11/1997 | Larson ........................ 361/706 |
| 6,108,205 A | * | 8/2000 | Bergstedt .................... 361/704 |
| 6,115,255 A | * | 9/2000 | Iovdalsky .................... 361/705 |
| 6,197,178 B1 | | 3/2001 | Patel et al. |
| 6,228,241 B1 | * | 5/2001 | Alwitt et al. .................... 205/50 |
| 7,303,315 B2 | * | 12/2007 | Ouderkirk et al. ............ 362/294 |
| 7,635,617 B2 | * | 12/2009 | Yamazaki ..................... 438/149 |
| 2002/0146853 A1 | * | 10/2002 | Karpov et al. .................. 438/20 |
| 2004/0213016 A1 | * | 10/2004 | Rice .............................. 362/547 |
| 2006/0261470 A1 | * | 11/2006 | Schick .......................... 257/718 |
| 2010/0003781 A1 | * | 1/2010 | Van Duren et al. ............. 438/98 |

FOREIGN PATENT DOCUMENTS

| | | |
|---|---|---|
| GB | 939394 | 10/1963 |
| GB | 2162694 | 2/1986 |
| WO | WO03/083181 | 10/2003 |

* cited by examiner

*Primary Examiner* — Courtney Smith
(74) *Attorney, Agent, or Firm* — Shumaker & Sieffert, P.A.

(57) ABSTRACT

An electrical power substrate comprises a metallic body at least one surface of the body having a coating generated by plasma electrolytic oxidation (PEO). The coating includes a dense hard layer adjacent the said surface of the metallic body, and a porous outer layer. Electrically conductive elements are attached to the said coating.

34 Claims, 9 Drawing Sheets

ELECTRICAL POWER SUBSTRATE

FIELD OF THE INVENTION

The present invention relates to an electrical power substrate and in particular to a substrate for use with power devices.

BACKGROUND OF THE INVENTION

Electronic and electrical devices are often mounted on a substrate. The requirements of such substrates include being an electrical insulator and in certain circumstances being a heat conductor. Typically, substrates have been used in the manufacture of circuit boards. Circuit boards generally form part of low power electronic devices. Even low power electronic devices generate significant heat, which must be conducted away from the heat generating device.

One substrate that has been identified as providing the properties of being an electrical insulator and a heat conductor is anodised aluminium or anodised aluminium oxide.

GB 2162694 describes a printed circuit board using anodised aluminium as the substrate on which is mounted components, such as a power transformer, of a circuit. The substrate includes heat sinks and a power transformer is mounted directly on the heat sink.

GB939394 describes an electric circuit structure which comprises a supporting member of conductive material and a non-conductive metal oxide coating of the same metal provided by anodising aluminium.

U.S. Pat. No. 4,015,987 describes a chip carrier and process for making the same. The substrate is anodized aluminium the top surface of which is coated with an adhesive and a thin copper foil laminated thereto. A photo resist is applied to the copper foil, followed by etching or plating.

U.S. Pat. No. 5,687,062 describes a thermally efficient circuit board which comprises a metal base such as aluminium, an anodized layer which may be of the same metal as the base, and a thin layer of insulative sealant.

Whilst anodised metal substrates do have improved thermal conduction and voltage breakdown characteristics when compared to resin based substrates often used in circuit board construction, the characteristics of anodised metals do limit the applications where they can be used. An anodised aluminium substrate cannot meet the requirements for use with high power devices, i.e. devices typically dissipating 20 watts at operating voltages in the range 12 volts dc to 300 volts dc and currents in the range 1 amp to 150 amps peak, with a break down voltage from the circuitry to ground of greater than 2.5 kV ac and 3.5 kV dc for safety reasons. The anodised aluminium substrate would break down because it does not have a sufficiently great voltage withstand and cannot dissipate the heat generated by the high power electronic devices.

The anodised aluminium substrate described in WO 96/33863 seeks to address the problem of poor voltage breakdown performance of anodised aluminium substrates. This is achieved by controlling the size of intermetallics within, and the surface roughness of the anodizable metal core. A dielectric polymer coating may also be applied to the anodized surface.

As mentioned above, the presently used substrates have been used in the production of printed circuits, but such substrates do not have characteristics which would allow them to be deployed for certain applications of electronic equipment. It would therefore be desirable to provide a substrate which can be deployed across a wider range of applications of electronic equipment.

WO 03083181 describes a process commonly known as plasma electrolytic oxidation which is a process developed for the treatment of light alloys. In the process a pulsed voltage is passed through a bath of electrolyte solution and applied to the substrate. The resulting plasma discharge rapidly produces a hard, fused ceramic layer on the surface of the component. The resulting ceramic coating consists of two distinct layers; a fused crystalline layer closest to the substrate which is extremely hard and dense; and a thinner porous outer layer. The resulting coating can withstand very high temperatures and is resistant to cracking. The coating is also able to withstand much larger thermal shocks than is the case for hard anodized aluminium. The resulting substrate may be modified to have certain desirable technical characteristics such as resistance to heat, or acting as a dielectric. These modifications are achieved by the addition of ultra-disperse insoluble powders (nano-powders) to the electrolyte during formation of the coating. The material is used in many applications where hard surfaces are required in areas exposed to extreme heat and have been identified as being suitable for use in the mounting of electrical components and to coat materials used to carry electronic windings and circuitry.

U.S. Pat. No. 6,197,178 describes an alternative method of plasma electrolytic oxidation. The process of plasma electrolytic oxidation may be referred to as electrochemical micro-arc oxidation is or micro-plasmic oxidation.

Substrates having a surface coating created by plasma electrolytic oxidation are not known for use in the manufacture of printed circuit boards. The present invention utilises the properties created by plasma electrolytic oxidation to provide an improved printed circuit board.

The invention also provides for the interconnection of high power devices.

SUMMARY OF THE INVENTION

According to one aspect of the invention there is provided an electrical power substrate as specified in the independent claim(s).

Preferred aspects of the substrate are set out in more detail in the claims dependent on the independent claim(s).

According to another aspect of the invention there is provided a method of manufacture as specified in the independent claim(s).

Preferred aspects of the method of manufacture of the substrate are set out in more detail in the claims dependent on the independent claim(s).

According to another aspect of the invention there is provided an electronically powered device comprising as specified in the independent claim(s).

Preferred aspects of the device are set out in more detail in the claims dependent on the independent claim(s).

The electrical power substrate of the invention is particularly advantageous when compared to power substrates based on anodised aluminium. The maximum voltage withstand of anodised aluminium is less than 1 kV dc. This is due to the columate structure of the anodised layer and its susceptibility to micro-cracking. The electrical power substrate of the invention provides a voltage withstand of greater 3.5 kV with the ceramic coating having a thickness of just 20 microns. Thicknesses of the ceramic coating can be increase to 200 microns thereby providing a significantly increased the voltage withstand. Where anodised aluminium is used and voltage withstands in excess of 1 kV are required, thick layers of epoxy loaded with non-conducting ceramic powders are applied to the anodised aluminum surface to achieve the required voltage withstand. Whilst this increases the voltage withstand of the substrate, the thermal efficiency of the substrate is reduced, as loaded epoxy is a relatively poor conductor of heat.

Furthermore, the use of plasma electrolytic oxidation allows metals to be used which cannot be anodised, such as magnesium, a metal used widely in the manufacture of light weight components.

The present invention provides an electrical power substrate having a voltage withstand great enough to allow the mounting of devices consuming significant amounts of power. Furthermore, the techniques employed to mount power consuming devices on to the substrate present very little resistance to the transfer of heat from a heat generating source to the substrate. In fact, the techniques employing screen printing of a resonate utilise the particular properties of a base metal having a ceramic coating generated by PEO extremely well, with the penetration of nano-scale particles of the resonate into nano-scale pores in the metal of the substrate the conduction of heat away from heat generating sources is extremely effective.

The filing of the pores in the porous layer of the coating and the nano-pores of the dense crystalline layer also enhances the di-electric properties of the substrate.

By using casting alloys of aluminium, magnesium and other lightweight metals, the substrate can itself form a heat sink or another part of the structure of a device. This provides designers of components with greater design freedom.

One of the principal advantages provided by the invention is the ability to remove wires and component mounting boards and replace them with printed circuit board technology, where wires are replaced by tracks, and components are connected to the same substrate as the tracks.

Figure 7:
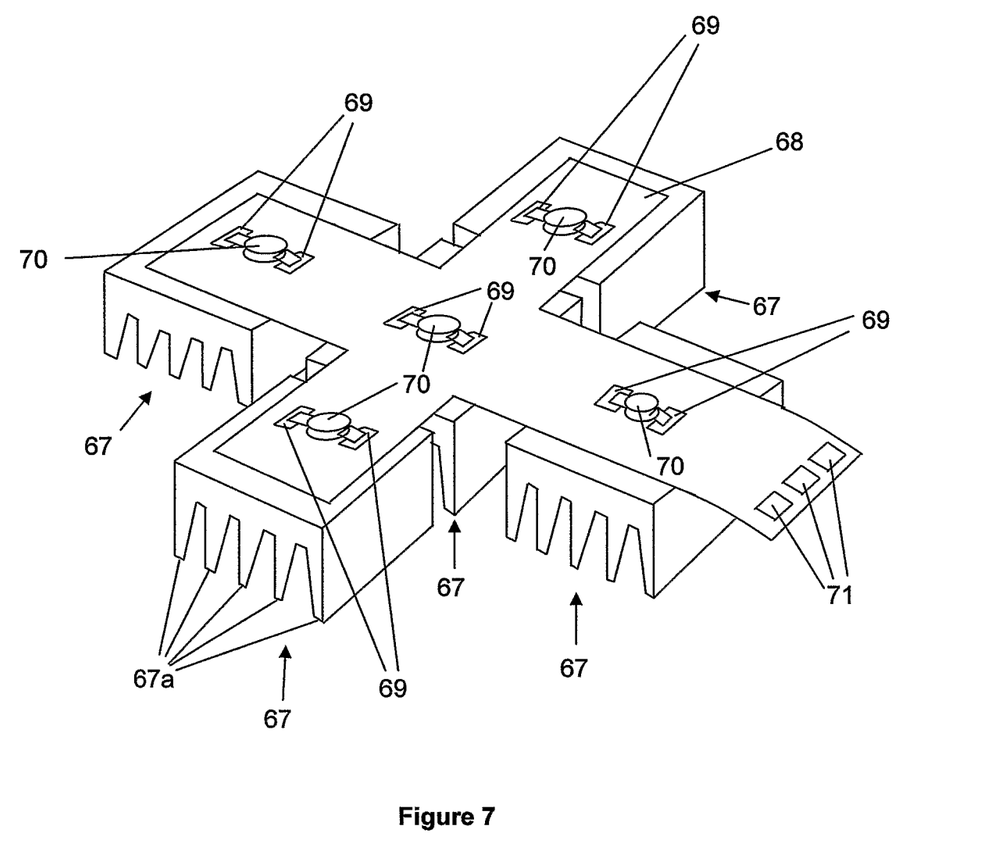
FIG. 7 is a three dimensional representation of an assembly forming part of a vehicle headlight construction.
Figure 8:
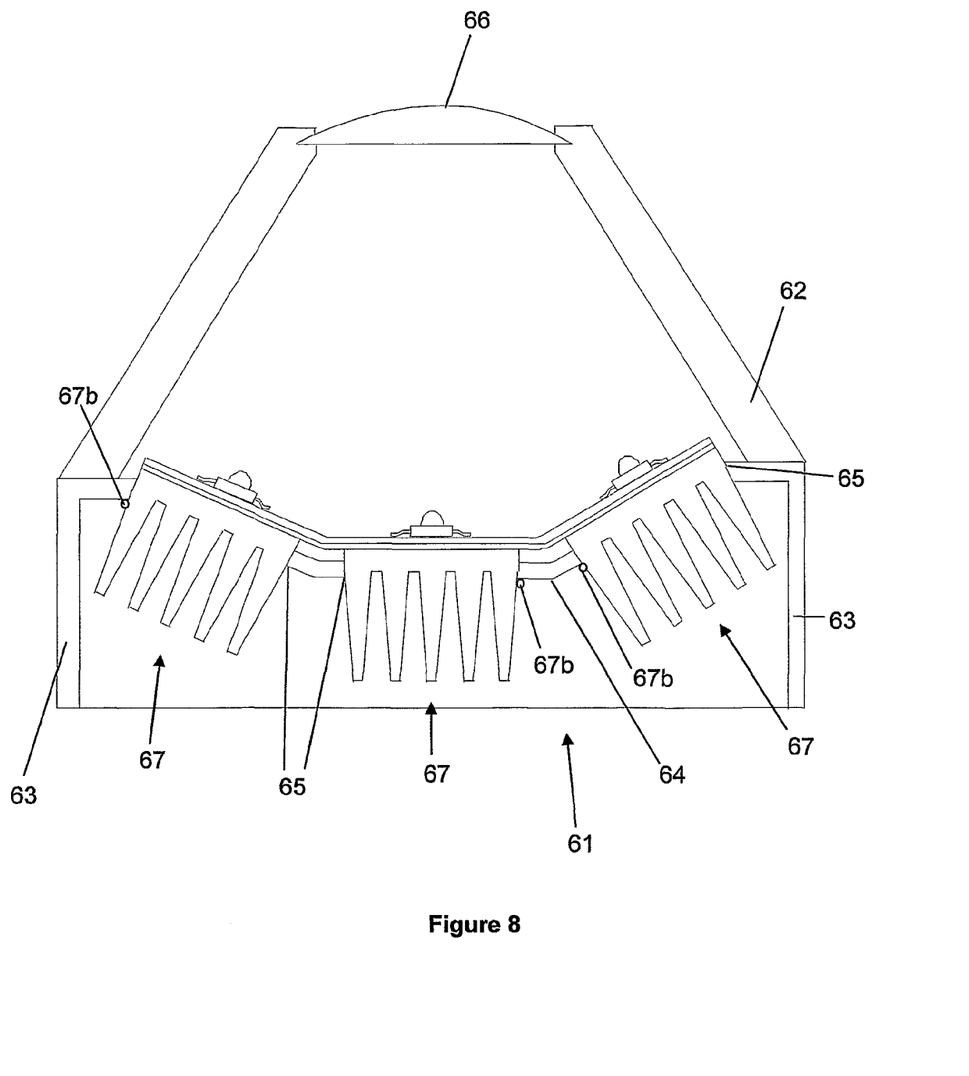
FIG. 8 is a schematic representation of a headlight including the assembly illustrated in FIG. 7.

Another advantage provided by the invention is the ability to manufacture pre-assemblies comprising a number of components in a planar structure which can subsequently be formed easily into a three dimensional structure. As illustrated in FIGS. 7 and 8, the manufacture of an electronic vehicle headlight can be made very simple and therefore cost effective.

BRIEF DESCRIPTION OF THE DRAWINGS

In the drawings, which illustrate preferred embodiments of a substrate according to the invention.

DETAILED DESCRIPTION OF THE DRAWINGS

In the Drawings, like numerals are used to indicate like components.

A first electrical power substrate according to the invention, and a method of manufacturing the same will now be described with reference to FIG. 1.

The substrate comprises a metal base 1 which in the example is an aluminium alloy and may be formed by rolling, extrusion, stamping or casting. A ceramic coating 2 is generated by subjecting the metal base 1 to a process of plasma electrolytic oxidation (PEO). The resulting ceramic coating 2 consists of two distinct layers; a fused layer closest to the substrate which is extremely hard and dense; and a thinner porous outer layer. Another result of plasma electrolytic oxidation is the formation of nano-scale pores in the dense layer. This effect is utilised in some aspects of the invention. The PEO process does not in itself form part of the invention and the process used may be of the type described in either WO 03083181 or U.S. Pat. No. 6,197,178.

The metal base may include aluminium, magnesium, titanium beryllium, nickel, alloys of these metals, which may include alloys formed from combinations of these metals as is known from WO 03083181.

The substrate resulting from the PEO process is referred to hereafter as the PEO substrate.

The next step in the process involves screen printing a surface of the PEO substrate with a resonate layer 20.

Resonate Layer

The resonate layer may take a number of forms. In one form the resonate includes a non-particulate solution of precious metal together with organic solvents, resins and glass forming additives, this form of resonate being known to those skilled in the art as a "metallo-organic" resonate.

Following screen printing the resonate is fired at a temperature of 500 to 600 C, and preferably at 570 C. When the temperature reaches around 350 C, the organic solvents and resins are burnt off. As the temperature reaches 400 C the glass forming additives start to form glass, which mixes to an extent with the precious metal (for example gold) in solution. However, the precious metal tends to settle on top of the glass, which adheres to the ceramic coating 2. As mentioned above, the coating 2 includes a porous layer, and a dense crystalline layer including nano-pores. The glass runs into the pores nano-pores in the coating 2. As such the glass adheres very strongly and in a manner which ensures excellent conduction of heat to both the base metal 1 and the precious metal which forms a dense thin layer of between 0.1 and 0.3 microns when the other components in the resonate have either been burnt off, or transformed into glass. The thin metallic layer is an extremely good conductor of both electricity and heat.

Another form of resonate is again a "metallo-organic", but relies on reactive bonding and uses nano-sized particles of a precious metal and another metal capable of bonding with the coating of the base material, rather than precious metal in suspension and glass forming agents. The resonate includes particles of precious metal, such as gold, and aluminium, each having a particle sizes of up to 200 angstroms, in suspension with organic solvents and resins. Particles of metals of such small size have very high surface energies which allow a metal layer to be produced at much lower temperatures than solid forms of the same metal. For example, where gold is the chosen precious metal a solid layer can be produced from the nano-sized particles when the resonate is fired to between 500 ad 600 C, rather than 1064 C which is the melting point of gold. The presence of aluminium in the resonate results in alumates being formed which chemically bond to the ceramic coating and the gold. The resulting layer of precious metal is between 0.1 and 0.3 micron and physically bonded by the said alumates to the ceramic coating 2. Where the base metal is of a material other than aluminium, an appropriate metal capable of bonding with the coating of the base material is selected.

Another form of resonate is again a "metallo-organic", with precious metal in solution, but instead of the resonate including glass forming additives, nano-sized glass particles are added during the firing step and refractory bonding is relied upon. The nano-particles of glass mix finely and intimately with the gold in solution resulting in a single layer containing both glass and precious metal, which is strongly adhered to the ceramic coating 2 through its pores and nano pores.

The methods of reactive and refractory bonding may be combined, the result being a combination of refractory gold/glass bonding and reactive gold/alumate bonding.

The proposed resonates allow very thin continuous layers of gold to be formed on an aluminium substrate while maintaining the firing temperature significantly below the melting point (660 C) of the aluminium substrate. The continuous layer may be of another precious metal, and the substrate may be of another lightweight metal or metal alloy.

Electroplating

The next step in the process involves electroplating the PEO substrate with a metallic layer 21 having a thickness in the example of about 150 micron, the resulting metallic layer 21 being used as the electrode and typically being formed of copper.

The electro-plating may be selective in both thickness and area to produce conductive tracks and pads to form an electrical circuit onto which components can be attached by soldering, wire bonding or conductive epoxy attachment.

Etching

By the application of photo-resists, exposure to UV light, etching and electroplating, tracks and pads may be formed in the metallic layer 21, for the mounting of components on the substrate or for transmission of power between components. Many iterations of this sequence may be performed to develop the aforementioned tracks and pads. Further, the thickness of tracks and pads may be increased or decreased by further etching or electroplating.

The invention also provides for the formation of different sets of tracks for use with components having different power requirements. Such tracks may be required where an electrically powered device is electronically controlled. The control circuitry may require relatively thin plating, for example in the order of 35 microns, whereas the power required by the electrical powered device requires thicker plating, for example in the order of 105 microns. The manufacture of a substrate with multiple sets of tracks requires steps of multiple applications of photo resists, re-exposure to UV and re-development. Typically, all tracks and pads would be exposed in the first exposure of the photo-resist to UV. Subsequently, a photo resist is applied to the substrate and those tracks and pads where a greater thickness is required are exposed to UV to remove the photo-resist covering those tracks and pads. To increase the thickness of tracks or pads a further step of electro-plating with copper is applied.

The final steps of the process comprise stripping the resists from the surface of the PEO substrate and etching to remove the precious metal layer between the tracks and pads During the step of etching, the tracks and pads may be protected by a photo etch resist which itself can be remove easily post etching. In a further step the tracks and pads are then plated to give a finish to which components can be attached by soldering or wire bonding, for example a nickel and gold electroplated finish.

High temperature solders may be used to attach components to the tracks and pads forming part of a circuit. This is advantageous as high temperature solders are lead free and have very good thermal efficiencies providing for heat to be conducted away from components quickly. In FIG. 1, the electro-plated metallic layer 21 is covered with a solder resist, in order that during soldering, only desired connections are made.

Figure 1:
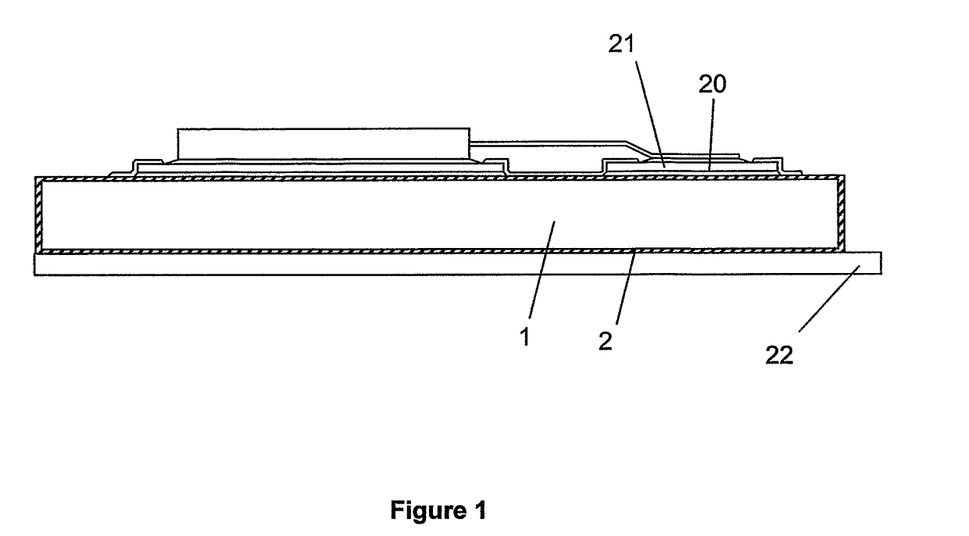
FIG. 1 is a side view of a substrate according to the invention mounting an electronic device.

As can be seen from FIG. 1, the substrate includes a heat pipe 22 arranged to provide a pathway for the transfer of heat to a region of lower temperature.

Figure 2:
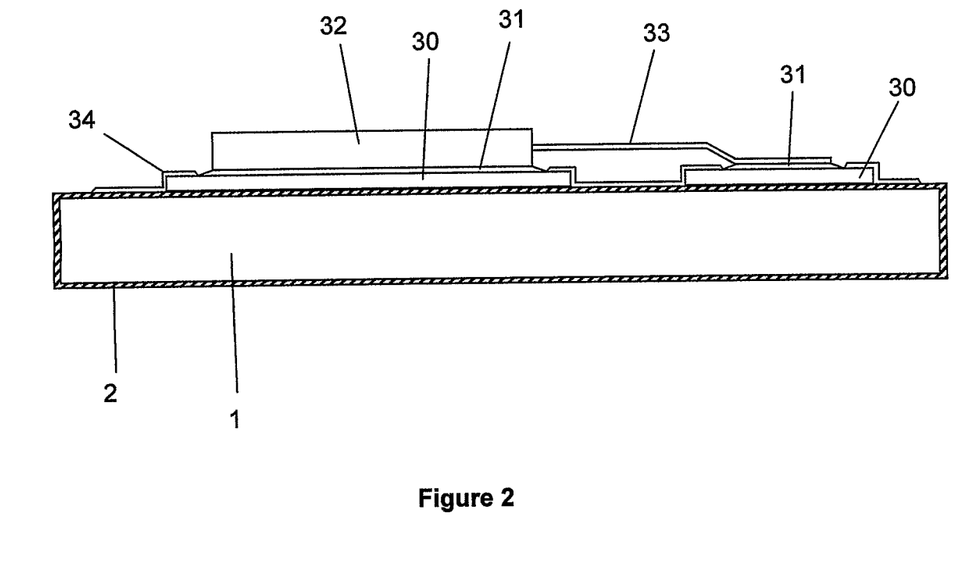
FIG. 2 is a side view of another embodiment of the invention.

A second electrical power substrate according to the invention, and a method of manufacturing the same will now be described with reference to FIG. 2.

The substrate comprises a metal base 1 having a ceramic coating 2. A track or pad 30 is built up on a surface of the ceramic coating 2 by screen printing a thick film comprising copper or silver on to the said surface. A track or pad formed from a single screen printed layer will have a thickness of around 15 microns. A power device 32 is attached to the pad 30 with a connector 33 attached at one end to the power device 32 and the other to a pad 30', attachment of the power device 32 to the pad 30 and the connector 33 to the pad 30' being by soldering, conductive epoxy or wire bonding, particularly for bare die power devices.

The process of building up the pads 30, 30' comprises screen printing a thick film paste onto the ceramic coating 2, drying the thick film and firing the thick film at a temperature of between 500 and 600 C. To build up layers having a thickness of 30 to 200 microns, the screen printing, drying and firing steps may be repeated sequentially.

Figure 3:
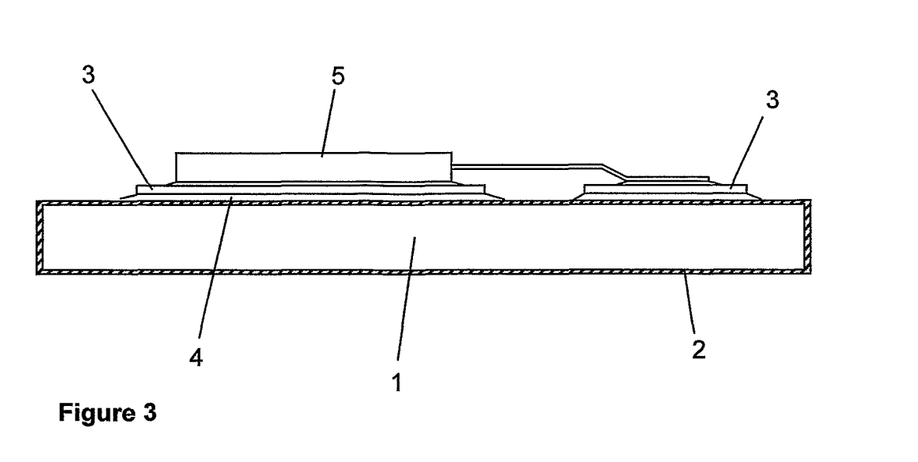
FIG. 3 is a side view of an alternative embodiment of the invention.

Referring now to FIG. 3, a substrate comprises a metal base 1 and a ceramic coating 2. Applied to the upper surface of the ceramic coating is a patterned metallic foil 3, which may be copper, aluminium or another suitable material. The metallic foil 3 is attached to the coating 2 by means of a thin adhesive layer 4, the thickness of the adhesive layer typically being less than 25 microns. By using a very thin layer of adhesive the thermal resistance of the adhesive layer does not have a serious negative effect on the thermal performance of the resulting electrical device. An electronic component 5 such as a power switching transistor is attached to the patterned metallic foil for example by soldering or conductive epoxy. A complete electronic circuit is therefore formed which may be used in applications such as DC to DC power converters, electronic motor drives, power LED's, brake actuators, etc.

The adhesive layer 4 coats one face of the metallic foil 3. The substrate is laminated with the metallic foil 3 and adhesive layer 4 under temperature and pressure, forcing the adhesive into the pores and nano-pores of the coating 2.

Figure 4:
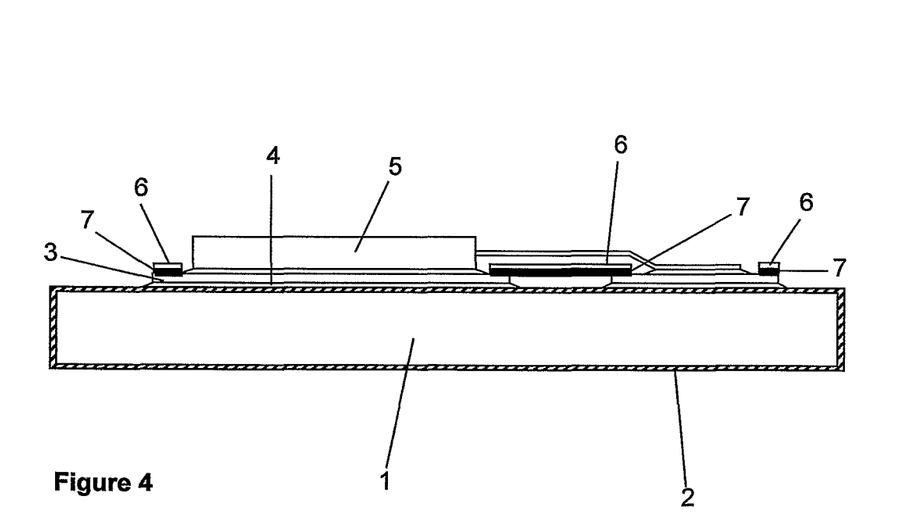
FIG. 4 is a side view of a further alternative embodiment of the invention.

Referring now to FIG. 4, the metallic foil 3 is attached to a polymer carrier sheet 6 by a layer of adhesive 7. The metal foil 3 may be patterned, for example by photo etching after attachment to the polymer carrier 6 but before attachment to the coating 2. Further, the polymer carrier may have apertures therein providing for the attachment of components to the metallic foil 3. The circuit may then be tested prior to the metal foil being attached to the coating 2.

The adhesive layer 4 is applied to one of the substrate or a face of the metallic foil 3. The substrate is laminated with the metallic foil 3 and adhesive layer 4 under temperature and pressure, forcing the adhesive into the pores and nano-pores of the coating 2.

An electrical power substrate according to another aspect of the invention, and a method of manufacturing the same will now be described with reference to FIG. 5. The substrate is very similar to that described with reference to FIG. 4, except that instead of a component 5 being attached to a metal foil 3, an interconnect or cross-over 8 is screen printed onto the upper surface 6a of the polymer 6. Apertures 10 are formed in the polymer carrier 6 and adhesive layer 7 so that during the process of screen printing the screen print material flows into the said apertures forming an electrical connection to the metallic foil 3. Following screen printing of the interconnect 8 the printed material is cured and forms an electrically conductive interconnection.

Figure 5:
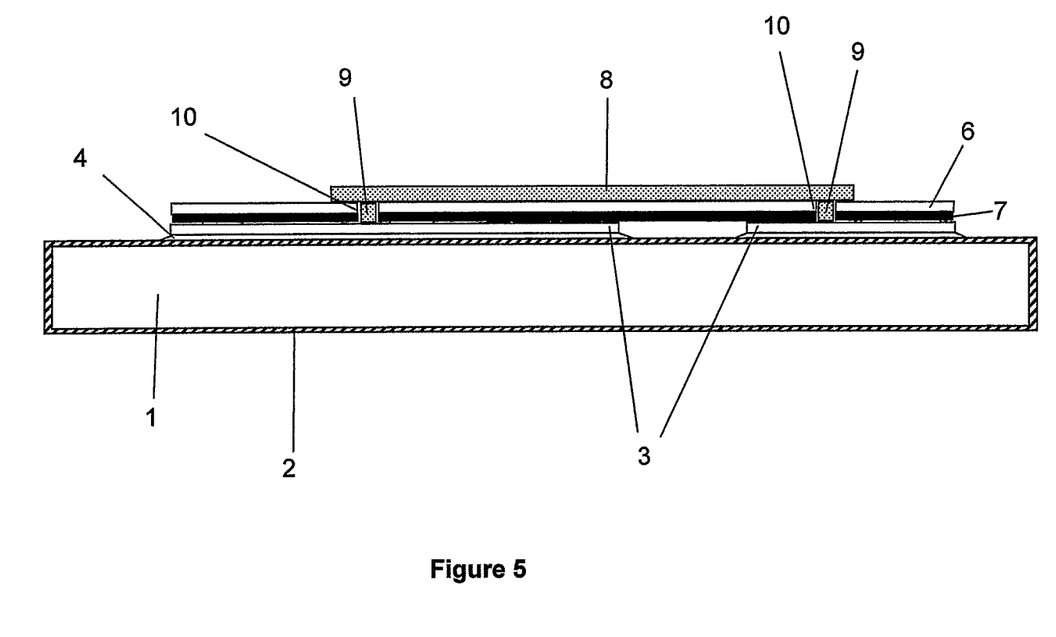
FIG. 5 is a side view of a further alternative embodiment of the invention.

In the example illustrated in FIG. 5, the screen print material comprised a polymer loaded with silver.

Figure 5A:
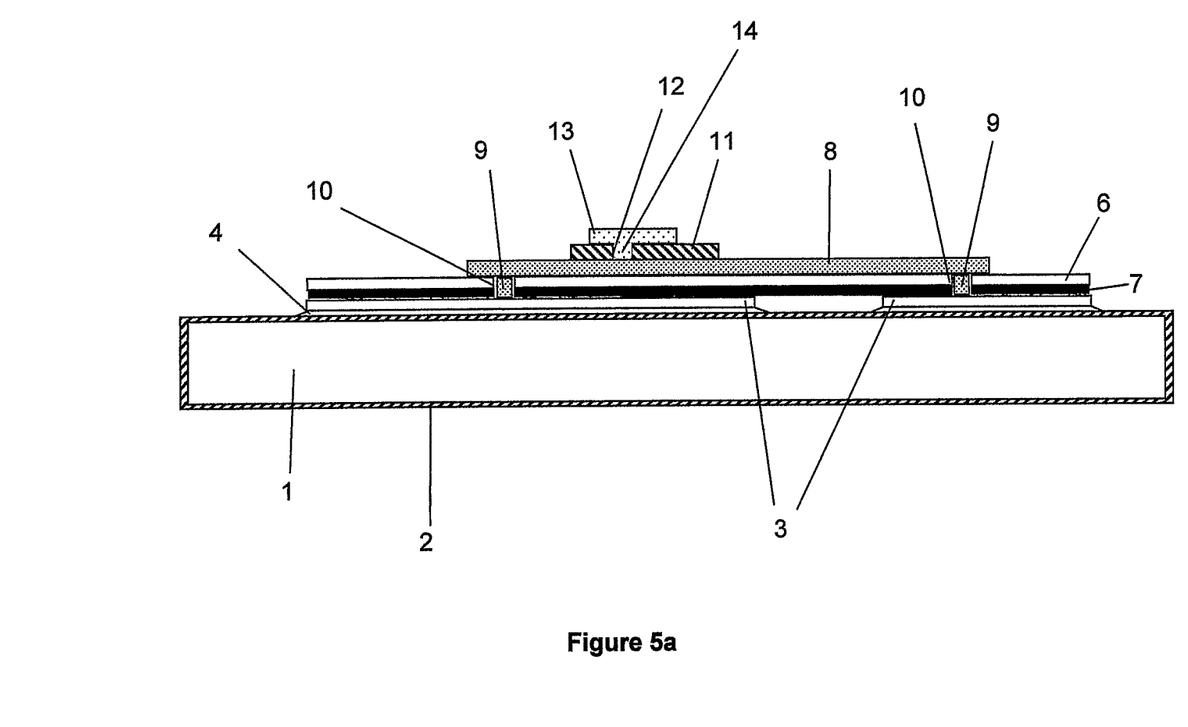
FIG. 5a illustrates the embodiment of FIG. 5 with an additional element.

The electrical power substrate illustrated in FIG. 5 may be used in a device requiring integrated power and control. Such a power substrate is illustrated in FIG. 5a. Current to the power drawing components is supplied through the metallic foil 3, which is typically copper, whereas current for the control components is supplied through the interconnect 8. Power components may be attached to the metallic layer 3 in the manner described with reference to FIG. 4. For this use, the interconnect 8 is in the form of tracks. To attach control components to the tracks of the interconnect 8, an insulating layer 11, such as dielectric epoxy is applied to the surface of the interconnect 8, and a top layer 13 of conductive material, such as silver epoxy is applied thereto. The control components are then attached to the uppermost conductive layer using solder or conductive epoxy. The advantage of the arrangement of FIG. 5a is that separate circuits can be provided, each matching different performance requirements. For example, the metallic foil layer 3 may comprise copper having a thickness of 105 microns, whereas the thickness of the silver layer may not need to be greater than 30 microns with spacing between the tracks in the silver layer much finer than in the copper foil layer. Further, by separating the control and power aspects of the circuit, heat sinking of each aspect may be addressed individually. This may be important where power consuming devices generate large amounts of heat, are subject to significant temperature shocks, and control devices are particularly sensitive to heat.

An alternative method of applying a layer of precious metal to the coating employs thin film technology, for example thin film evaporation or thin film sputtering.

Figure 6:
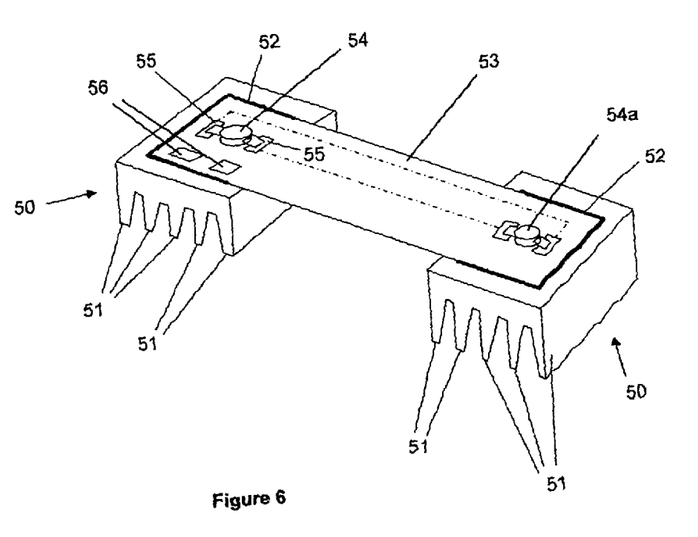
FIG. 6 is a three dimensional representation of a device according to the invention.

The metal base 1 may be cast from casting alloys of light weight alloys, such as alloys of aluminium or magnesium including silicon which promotes flow and minimises porosity. A ceramic coating may be formed on the surface of this material by the PEO process, whereas an anodised surface cannot be formed on such a material. Substrates of complex shape may therefore be formed by casting, for example heat sinks, component mounts, etc. Such an arrangement is illustrated in FIG. 6. The arrangement comprises two substrates 50 each manufactured from a casting alloy, the substrates 50 each including fins 51. The surface of each substrate 50 is subjected to the PEO process to produce a coating and a copper foil 52 of a polymer copper foil laminate 53 is attached to the coating of the substrate 50 in the same manner as illustrated and described with reference to FIGS. 4 and 5. Openings 55 in the polymer of the polymer copper laminate 53 provide for attachment of a Light Emitting Diode (LED) to the copper foil 52. Openings 56 in the polymer of the polymer copper laminate 53 provide for attachment of a power supply to the copper foil 52. A power supply is attached to just one of the substrates 50, and therefore an interconnect to transmit power to the other substrate is required. The polymer copper laminate 53 includes a copper track interconnect etched in the copper foil 52, through which power and control signals are provided to the LED 54a.

The ability to use casting alloys allows the control and power requirements to be incorporated into devices as will be described in greater detail with reference to FIGS. 7 to 9.

Referring first to FIGS. 7 and 8, a headlight 60 comprises a base 61 and a lens mount 62 and an LED mounting assembly. The LED mounting assembly comprises five heat sinks 67 each formed from a casting alloy, and having been subjected to a PEO process. An LED assembly comprises a cross-shaped flexible polymer copper laminate 68 which is attached to the heat sinks 67 in the manner described above in relation to FIGS. 5 and 6. The end of one element of the cross-shaped polymer board is provided with pads 71 which in use are connect to an electrical power source and/or control signal. Again, an interconnect is provided by copper tracks etched into the copper of the polymer copper laminate for distribution of power and/or control signals to the LEDs 70. Printed polymer interconnects as previously described could be used for cross-overs and low power interconnects. An interconnect for delivering electrical power and control signals may be fabricated in the manner described with reference to FIG. 5a.

The LED mounting assembly is fabricated in planar form using conventional pick and place automated assembly lines. This allows the LED's to be positioned accurately and at low cost. The flexibility of the interconnect allows the LED assembly to be brought into a three dimensional configuration easily as described with reference to FIG. 8 below.

FIG. 8 illustrates the assembled headlight 60, the LED mounting assembly being mounted in the base 61, which includes side walls 63 and a profile 64 connected to the said walls. The profile including a plurality of openings 65 each arranged to receive a heat sink element 67. The shape of the profile is such that with the heat sink elements 67 located in the openings, the LED's 70 do not lie in a common plane.

The lens mount 62 fits onto the base 61. The shape of the profile 64 and the position and specification of the lens 66 are such that light emanating from LED's 70 is focused by lens 66 to generate a light output appropriate for a vehicle headlight.

As can be seen from FIG. 7, the heat sinks 67 are joined together in an LED mounting assembly, in which the upper surfaces of each heat sink 67 lie in a common plane.

Referring now to FIG. 8, the headlight is assembled by presenting the LED mounting assembly up to the profile 64 and pressing the heat sinks 67 of the assembly into the openings 65. Each heat sink 67 may be provided with a retention means, such as a protrusion 67b, which prevents the heat sink 67 from working free from the profile 64 in use (for the sake of clarity a protrusion 67b is shown to one side of each heat sink 67, whereas a protrusion 67b may be provided on each side of the heat sink 67). The retention means may comprise any other suitable means for retaining the LED mount in the housing 60.

The location of the apertures 65 and the shape of the profile 64 provide that when the heat sinks 67 are located and secured in the said apertures 65 the LED's 70 are aligned so as to produce a focused beam of light through the lens 66. This provides a simple and low cost method of achieving both orthogonal and angular placement accuracies of the LED's and at the same time providing a high reliability method of power interconnect to the LED's.

The example illustrated in FIGS. 7 and 8 requires flexibility between the heat sinks 67 and hence polymer interconnects are used. Where a device requires discrete heat sinks, but no flexibility is requited between those heat sinks, a casting may comprise the heat sinks and connectors between them. The whole casting is then subjected to the PEO process. The process described with reference to FIG. 1 or 2 would then be applied to the ceramic coating of the casting to enable devices to be electrically mounted on the casting. Such devices may consist of LED's, or other power consuming devices such as power switching semi-conductors used with a stepper motor associated with a wheel brake of a vehicle.

One advantage of an assembly according to the invention and its method of manufacture is that the source of heat, that is the electricity consuming device, can be mounted directly onto the heat sink, thus eliminating at least one thermal interface. With the assembly of the present invention there is significantly less opportunity for failures of connection from heat sources to heat sinks as the connections are physically bonded to the heat sink.

Another advantage of the interconnect of the invention is that the number of discrete connectors, such as wires, can be significantly reduced thereby enhancing reliability and significantly reducing contact resistances. In harsh operating environments, such as those endured by some components of vehicles, the components and hence any connectors associated therewith are subjected to vibration, dirt, temperature shocks, and extremes of temperature. Wire connectors are likely to fail in such environments.

Figure 9:
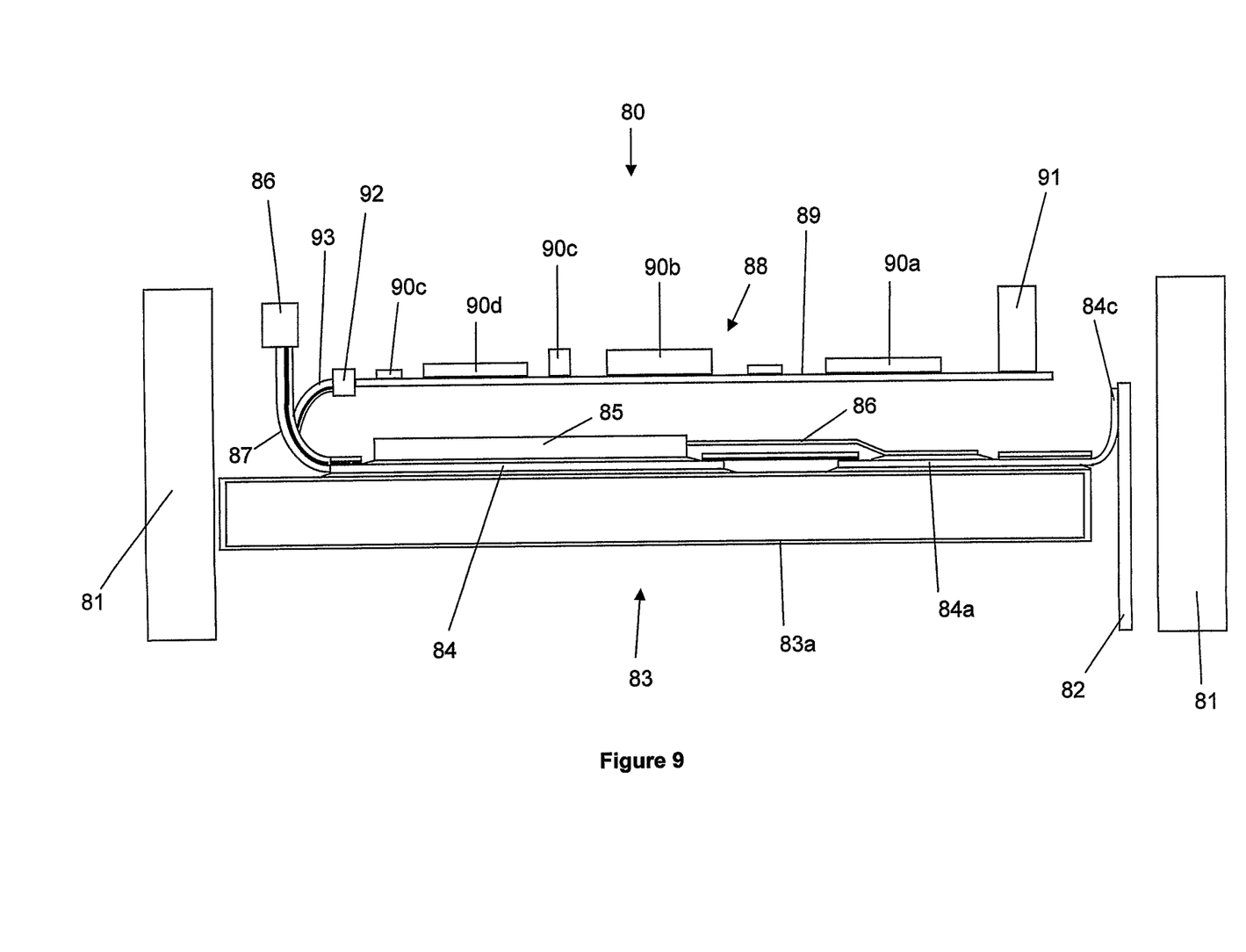
FIG. 9 is a schematic representation of a water pump according to the invention.

FIG. 9 illustrates an electronically powered water pump 80 for an internal combustion engine. The pump 80 comprises a body 81 which an electric motor comprising a rotor and a stator (not shown). Electronic power is delivered to the stator windings 82 via power devices 84 mounted on an electrical power substrate 83 of the type illustrated in and described with reference to FIG. 4. The substrate 83 includes patterned copper foils 84, 84a. Power devices 85 are attached to the foil 84 by means of conductive epoxy or solder. A power output 86 extends from the power devices and is attached to the foil 84a, which foil is attached at 84c to the stator windings 82 by means of crimping, welding or soldering. The electric motor requires both power and control. Power to the foil 84 upon which the power devices 85 are mounted is connected drawn from a power supply in the form of a battery 86 via an extension 87 of the copper foil 84 and its polymer carrier. Control of the motor is achieved by controlling the power devices 85. This is achieved by a controller 88 comprising a board 89 which mounts an array of control devices 90a to 90e, an input connection 91 to the main engine control unit (ECU) and an output connection 92 for connecting the output of the controller 88 to the foil 84 and hence the power devices 85. The output connection 92 is connected to the copper foil 84 by means of tracks formed in an extension 93 of the said copper foil 84, each track being connected to a respective one of the control devices 90a to 90e.

The underside 83b of the substrate 83a is immersed in the water (coolant fluid) being pumped by the motor. The power devices 85 generate a significant amount of heat which is conducted through the substrate 83a to the water which acts as a coolant.

In the example illustrated in FIG. 9, the control board is not directly attached to the substrate 83a. The electrical power substrate 83 may be of the type illustrated in FIG. 5a, in which case the control board could be built up on the substrate.

The invention claimed is:

1. An electrical power substrate comprising a metallic body, at least one surface of the body having an electrically insulating and thermally conductive plasma electrolytic oxidation (PEO) coating generated by plasma electrolytic oxidation, wherein the coating includes a dense hard layer adjacent the surface of the metallic body and a porous outer layer separated from the at least one surface of the body by the dense hard layer, wherein the dense hard layer is electrically insulating, and wherein electrically conductive elements are attached to the coating.

2. An electrical power substrate according to claim 1, wherein the electrically conductive elements comprise at least one foil glued to the substrate.

3. An electrical power substrate according to claim 1, wherein the electrically conductive elements comprise a metal applied to the coating of the metallic body as a thick film.

4. An electrical power substrate according to claim 1, wherein the electrically conductive elements are attached to the coating by an intermediate layer, and wherein the electrically conductive elements are electroplated onto the intermediate layer.

5. An electrical power substrate according to claim 4, wherein the intermediate layer is applied to the coating of the substrate by one of screen printing, offset printing, spraying, draw bar application, thin film evaporation, and thin film sputtering.

6. An electrical power substrate according to claim 4, wherein the intermediate layer is formed by application of a resonate to the surface of the coating.

7. An electrical power substrate according to claim 6, wherein the resonate comprises a metal having a melting point greater than that of glass.

8. An electrical power substrate according to claim 7, wherein the metal is dissolved in a metalorganics solution, the solution including glass forming compounds, which compounds form glass upon firing at a first threshold temperature, the so formed glass bonding to pores in the porous outer layer and nano-pores in the dense hard layer of the coating and forming a glass layer on the surface of the coating, and wherein upon firing to a second threshold temperature greater than the first threshold temperature, a layer of the metal is formed which is adhered to the glass layer.

9. An electrical power substrate according to claim 6, wherein the resonate comprises particles of the metal in a suspension, the particles having a size in the nano-scale.

10. An electrical power substrate according to claim 9, wherein the particle size is less than or equal to two hundred angstroms.

11. An electrical power substrate according to claim 10, wherein the resulting layer of metal has a thickness in the range of from about 0.1 to about 0.3 microns.

12. An electrical power substrate according to claim 9, wherein the resonate further comprises particles of a second metal, the particles of the second metal having a size in the nano-scale, wherein the second metal forms a bond between the surface of the coating and the first metal via a reactive bonding process.

13. An electrical power substrate according to claim 10, wherein the substrate is fired and, during firing, nano-sized particles of glass or glass forming compounds are added, the glass melting upon firing to a first threshold temperature, the glass bonding to pores in the porous outer layer and nano-pores in the dense hard layer of the coating and to the particles of the first metal, the bonding mechanism being refractory bonding.

14. An electrical power substrate according to claim 12, wherein the resonate comprises nano-sized particles of the second metal and the substrate is fired and, during firing, nano-sized particles of glass are introduced, and wherein the second metal is capable of forming and forms a reactive bond between the surface of the coating and the first metal, and wherein the glass bonds to pores in the porous outer layer and nano-pores in the dense hard layer of the coating and to the particles of the first metal by refractory bonding.

15. An electrical power substrate according to claim 12, wherein the second metal is selected from the group comprising: aluminium, magnesium, titanium, beryllium, nickel, and alloys of the aforementioned elements.

16. An electrical power substrate according to claim 1, wherein a metal from which the metallic body is formed is selected from the group comprising aluminium, magnesium, titanium, beryllium, nickel, and alloys of the aforementioned elements.

17. An electrical power substrate according to claim 1, further comprising at least one additional set of electrically conductive elements located above and spaced apart from the electrically conductive element closest to the coating of the metallic base.

18. An electrical power substrate according to claim 17, wherein one set of electrically conductive elements is provided for attachment of control devices thereto, and another set of electrically conductive elements is provided for the attachment of power devices, and wherein the thickness and/or the material of the respective conductive elements for control and power differ.

19. An electrical power substrate according to claim 18, wherein one of the sets of electrically conductive elements comprises an electrically conductive polymer.

20. An electronically powered device comprising an electrical power substrate as claimed in claim 1.

21. An electronically powered device according to claim 20, wherein the metallic body is a heat sink.

22. An electronically powered device according to claim 21, wherein the heat sink comprises a plurality of fins or channels.

23. An electronically powered device according to claim 21, wherein the metallic body includes at least one heat pipe.

24. An electronically powered device according to claim 22, wherein the metallic body is formed from a casting alloy.

25. An electronically powered device according to claim 21, comprising a plurality of metallic bodies, each functioning as a heat sink, and an interconnect attached to each of the bodies, the electrically conductive elements forming part of the interconnect.

26. An electronically powered device according to claim 25, wherein the interconnect comprises a flexible substantially planar element attached to each of plurality of metallic bodies.

27. An electronically powered device according to claim 25, wherein the interconnect is substantially rigid.

28. An electronically powered device according to claim 27, wherein the interconnect and the plurality of metallic bodies are formed integrally in a casting.

29. An electronically powered device according to claim 20, wherein the metallic body forms part of the structure of the device.

30. An electronically powered device according to claim 20, comprising a control circuit and a power circuit, the control circuit controlling the power distributed to the power circuit.

31. An electronically powered device according to claim 30, comprising at least two sets of electrically conductive elements, the thickness and/or material of the electrically conductive elements of each set being different.

32. An electronically powered device according to claim 20, wherein the device is one of a vehicle headlight, a water pump for an internal combustion engine, a brake actuator, a windscreen wiper motor, a stepper motor, a linear actuator, a laser diode, and a micro-processor.

33. An electronically powered device according to claim 25, wherein the device is a lamp and comprises at least one light emitting diode mounted on each of the metallic bodies, and wherein each of the metallic bodies is located in an opening in a housing, the housing mounting a lens and being so shaped and dimensioned as to direct the output beams of the light emitting diodes towards the lens.

34. A method comprising forming an electrically insulating and thermally conductive coating, via plasma electrolytic oxidation (PEO), on at least one surface of a metallic body, wherein the coating includes a dense hard layer adjacent the surface of the metallic body and a porous outer layer separated from the at least one surface of the body by the dense hard layer, wherein the dense layer is electrically insulating, and wherein electrically conductive elements are attached to the coating.

* * * * *